United States Patent [19]

Betts

[11] 4,101,964

[45] Jul. 18, 1978

[54] DIGITAL FILTER FOR PULSE CODE MODULATION SIGNALS

[75] Inventor: William L. Betts, St. Petersburg, Fla.

[73] Assignee: The United States of America as represented by the Secretary of the Army, Washington, D.C.

[21] Appl. No.: 647,537

[22] Filed: Jan. 8, 1976

[51] Int. Cl.² ........................... G06F 7/38; G06F 15/34
[52] U.S. Cl. ........................................ 364/724; 325/42; 333/18; 364/723
[58] Field of Search ................... 235/152, 156; 325/42; 333/18

[56] References Cited

U.S. PATENT DOCUMENTS

| 3,292,110 | 12/1966 | Becker et al. | 333/18 |
| 3,629,509 | 12/1971 | Glaser | 235/152 UX |
| 3,686,489 | 8/1972 | Hobrough | 235/152 |
| 3,808,412 | 4/1974 | Smith | 235/152 |
| 3,855,423 | 12/1974 | Brendzel et al. | 333/18 X |
| 3,906,218 | 9/1975 | Nussbaumer | 235/156 |
| 3,949,206 | 4/1976 | Edwards et al. | 325/42 X |

OTHER PUBLICATIONS

D. Esteban et al., "Quadratic Interpolation Used as Low-Pass Filter", IBM Tech. Disclosure Bull., vol. 16, No. 12, 5-1974, pp. 3947-3949.

Sheingold, "Analog-Digital Conversion Handbook", copyright 1972 by Analog Devices, Inc., pp. I-87, I-88.

*Primary Examiner*—Jerry Smith
*Attorney, Agent, or Firm*—Nathan Edelberg; Jeremiah G. Murray; Sheldon Kanars

[57] ABSTRACT

A digital filter for pulse code modulation signals employs interpolation. A digital filter can handle a multiplicity of multiplexed pulse code modulation channels.

1 Claim, 4 Drawing Figures

CIRCLED VALUES ARE CHANNEL #1

DIGITAL FILTER FOR PULSE CODE MODULATION SIGNALS

BACKGROUND OF THE INVENTION

The present invention relates to digital data filters and more particularly to digital data filters for processing pulse code modulation signals.

With the rapid growing use of digital data systems and in particular pulse code modulation systems, the need for effective digital filtering has been steadily increasing.

SUMMARY OF THE INVENTION

The present invention provides a method of interpolating pulse code modulation signals as they are received as a stream of data, and producing from the stream a filtered stream of output signals. The present invention performs this filtering by interpolation on a multiplicity of multiplexed channels.

It is, therefore, an object of the present invention to provide a new and improved digital filter for pulse code modulation signals.

Another object of the present invention is to provide a digital filter for pulse code modulation signals which accomplishes the filtering by interpolation on multiplexed channels.

BRIEF DESCRIPTION OF THE DRAWINGS

These and other objects of the present invention will become more apparent from the following description taken in connection with the accompanying drawings, in which.

DESCRIPTION OF THE PREFERRED EMBODIMENT

Figure 1:
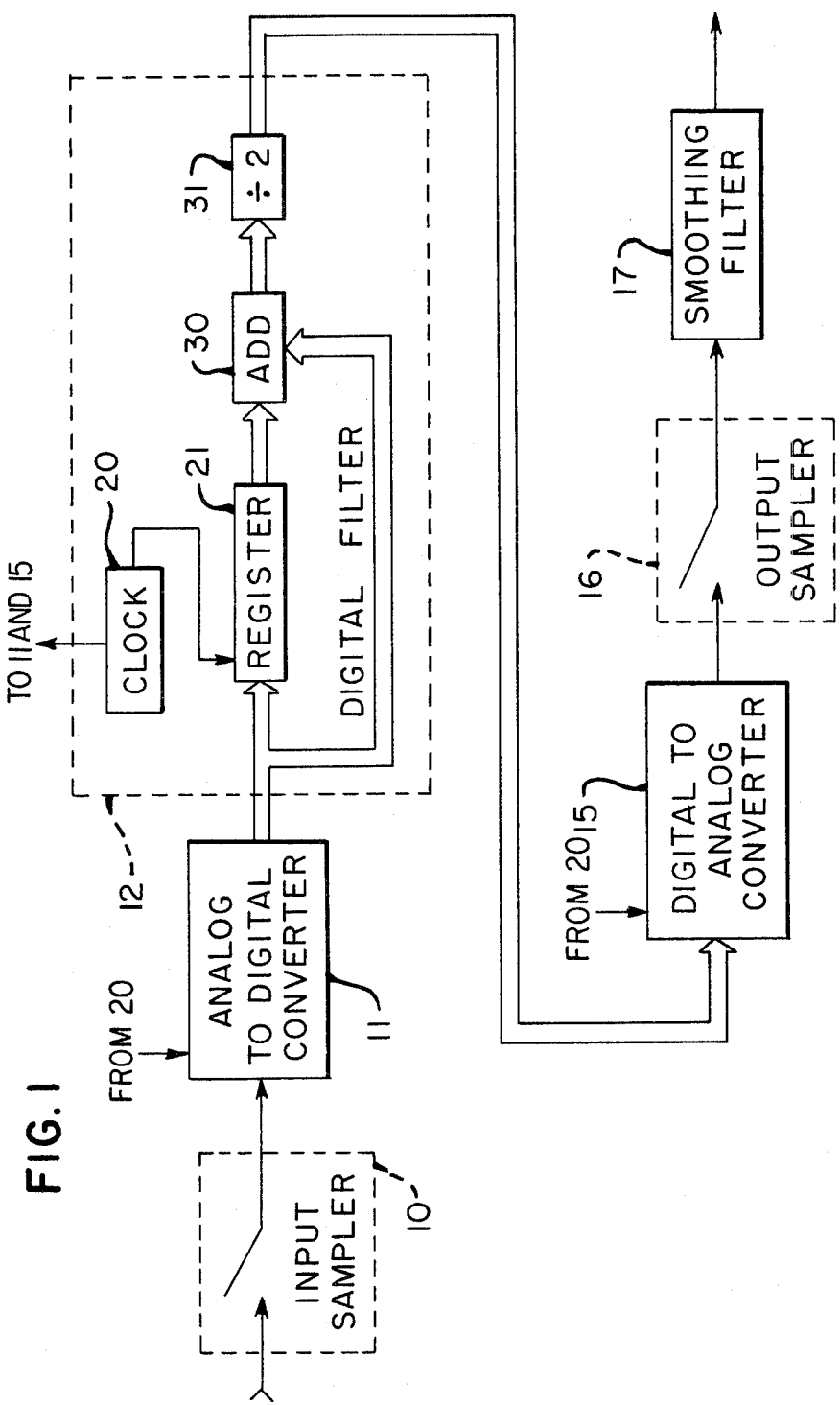
FIG. 1 is a schematic diagram of a, single channel sample data system, preferred embodiment of the invention.

While this invention is susceptible of embodiments in many different forms, there is shown in the drawings and will herein be described in detail, embodiments of the invention with the understanding that the present disclosures are to be considered as exemplifications of the principals of the invention and are not intended to limit the invention to the embodiments illustrated. The scope of the invention will be pointed out in the appended claims.

Figure 2:
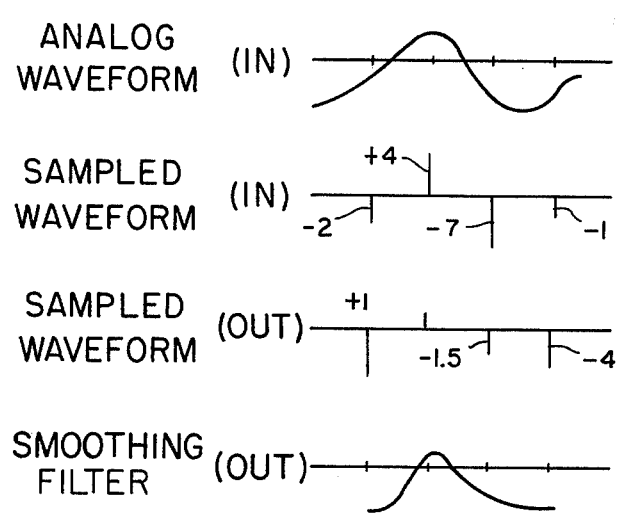
FIG. 2 is a series of wave forms taken at different points in the system illustrated in FIG. 1.

FIG. 1 illustrates a simple single channel sample data system. An input analog waveform shown in FIG. 2 is sampled by an input sampler 10. The output of the sampler 10 is a pulse train as illustrated in FIG. 2. This input digital pulse train is transferred to an analog to digital converter 11, which converter converts the input sample pulses to a digital form of pulse code modulation (PCM). The analog to digital converter 11 is connected to an interpolator generally indicated at 12 by a dashed line. Each PCM signal transferred from the analog to digital converter 11 to the interpolator 12 represents an instantaneous value of the input analog waveform taken at a sampling instant. The interpolator 12 serves as a digital filter to operate on this numerical sequence. The interpolator 12 comprises a one stage register 21, an adder 30 and a divider 31 connected in series. The input to the interpolator 12 is connected to the register 21 and to the adder 30 to add the PCM numbers present at the input and at the output of the register 21. The register is loaded by a sampling clock 20 which is synchronized to the input samples. The numerical sequence is delayed one sampling interval by the register 21. The result is to add adjacent samples in the numerical sequence. The output of the adder is then divided by two by the divider 31. Thus, the sequence is interpolated over two sample values by the familiar expression:

$$(A + B)/(2)$$

As shown in FIG. 2, the first input sample pulse is a $-2$ followed by a $+4$. This results in an output of 1. The $+4$ is followed by a $-7$ which results in $-1.5$. The $-7$ is followed by a $-1$ which results in a $-4$. The series of interpolator signals produce a numerical sequence of PCM output signals which are transferred to a digital to analog converter 15. The converter 15 produces a sequence of voltage pulses forming a sampled output signal as illustrated in FIG. 2. The sampled output signal is transferred to an output sampler 16. The sampled waveform from sampler 16 passes through a smoothing filter 17 which filter produces a smooth analog waveform at its output as illustrated in FIG. 2. This output analog waveform is similar to that of the input waveform but is filtered and interpolated by the interpolator 12.

Figure 3:
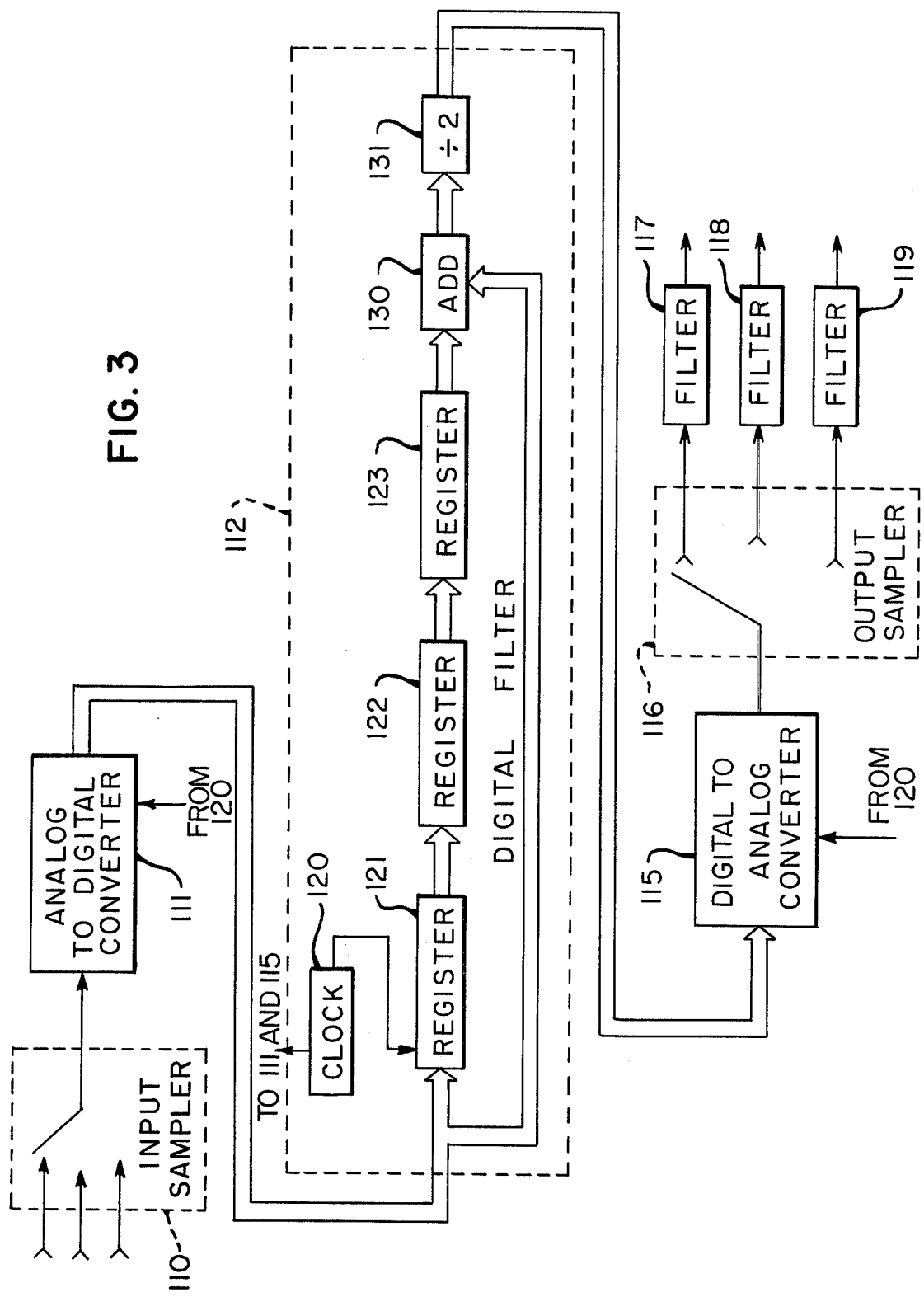
FIG. 3 is a schematic diagram of a, multiplexed sample data system, preferred embodiment of the invention.

FIG. 3 shows a three channel sample data system which is similar to the system shown in FIG. 1 with the exception of the interpolator 112. Significant reduction in circuitry is made possible by time sharing elements of the digital filter. Time shared data is easily handled by the samplers and by the converters since the data is received and transmitted sequentially by these circuits. However, sharing of a digital filter is difficult because of the memory required for its implementation. The elements of FIG. 3 which correspond to the elements of FIG. 1 are assigned identification numbers in the hundred series corresponding to the elements of FIG. 1 in the ten series.

Figure 4:
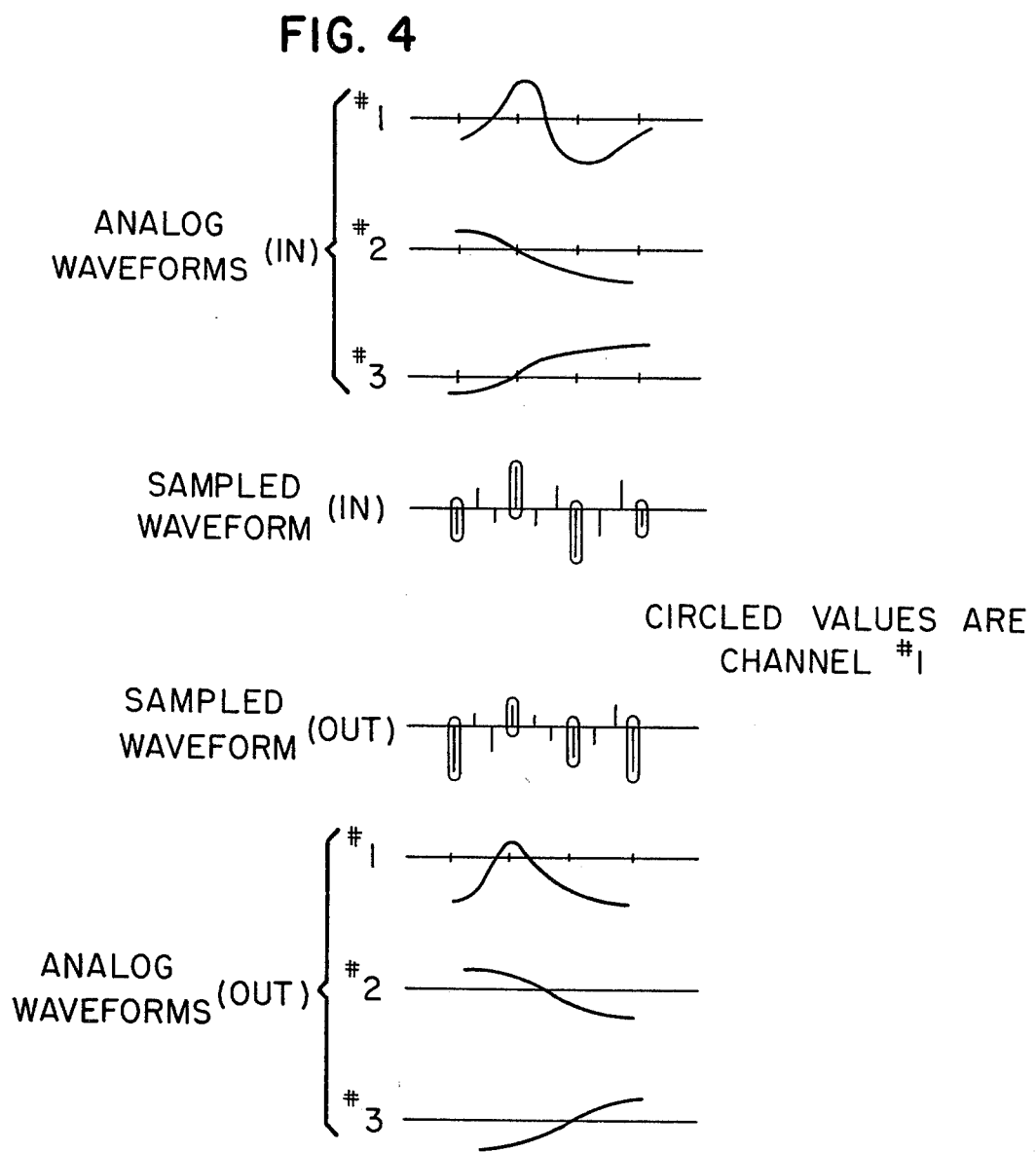
FIG. 4 is a series of waveforms taken at different points in the system illustrated in FIG. 3.

The interpolator 112 provides a technique for time sharing digital filter arithmetic logic by the use of simple shift registers. Three or more waveforms, each on a different channel, are illustrated in FIG. 4. The sampling rate of the system illustrated in FIG. 3 is three times that of the sampling rate of the system in FIG. 1 to accommodate the two additional channels. The numerical sequence now contains samples of the three different channels. Single shift register 21 has been replaced by a shift register memory consisting of shift registers 121, 122 and 123 connected in series as illustrated in FIG. 3. The memory is then connected in series with the adder 130 and the divider 131 as further illustrated in FIG. 3. An input to the interpolator 112 is connected to the register 121 and the adder 130 so that, when a signal is received for a given multiplexed channel, both that signal and the previous signal from that channel, such as Channel 1, are simultaneously received by the adder 130 and are added. Since the number of shift registers corresponds to the number of channels of analog waveforms being received and processed, the proper last PCM signal is transferred to the adder 130 at the same time the next PCM signal for that channel is received at the input of the interpolator.

The divider 131 performs the usual division of shifting the binary point left one bit and trunkating the least significant bit. The output of the interpolator 112 is then fed through a digital to analog converter 115 to produce the output pulse signals illustrated in FIG. 4. These signals are in turn processed by an output sampler 116 which, in addition to transforming them into analog waveforms, redistributes them on three different channels, each of which has respective individual analog filters 117-119. The smoothed analog waveform output of filters 117-119 are illustrated in FIG. 4. By providing higher sampling rates and utilizing the multiple stage shift register memory of the interpolator 112, a number of channels can be processed by only one set of input and output samplers, one adder, one divider, and one set of converters. This represents a considerable savings in circuit components for the technique may be utilized to handle relatively large numbers of channels. For example, equipment being presently manufactured processes sixty-four channels.

I claim:

1. A digital filter for filtering a plurality of pulse code modulation signals appearing on separate input lines comprising:
    sampling means for sampling each said input line in succession;
    analog to digital means for sequentially converting the samples from said sampling means into digital form;
    a plurality of serially connected single stage registers wherein the number of registers is equal to the number of said input lines, having the input to said plurality of serially connected registers connected to the output of said analog to digital means;
    an adder means having one input connected to the output of said plurality of serially connected registers and a second input connected to the output of said analog to digital means for adding successive samples from a common one of said input lines and for adding samples from a different one of said input lines in succession;
    a dividing means responsive to the output from said adder for averaging the output from said adder by dividing said adder output by two; and
    digital to analog means for converting the averaged signal from said divider into analog form.

* * * * *